United States Patent [19]

Corder

[11] Patent Number: 5,617,551

[45] Date of Patent: Apr. 1, 1997

[54] CONTROLLER FOR REFRESHING A PSRAM USING INDIVIDUAL AUTOMATIC REFRESH CYCLES

[75] Inventor: Rodney J. Corder, Huntington Beach, Calif.

[73] Assignee: New Media Corporation, Irvine, Calif.

[21] Appl. No.: 947,182

[22] Filed: Sep. 18, 1992

[51] Int. Cl.$^6$ ..................................... G11C 7/00
[52] U.S. Cl. .................... 395/401; 395/414; 395/433; 365/222
[58] Field of Search .................. 395/425, 400, 395/432, 433, 414, 428; 365/222, 233, 193

[56] References Cited

U.S. PATENT DOCUMENTS

| | | | |
|---|---|---|---|
| 3,748,651 | 7/1973 | Mesnik | 365/222 |
| 3,800,295 | 3/1974 | Anderson, Jr. et al. | 365/222 |
| 4,172,282 | 10/1979 | Aichelmann, Jr. et al. | 345/425 |
| 4,317,169 | 2/1982 | Panepinto, Jr. et al. | 345/425 |
| 4,360,903 | 11/1982 | Plachno et al. | 365/222 |
| 4,723,204 | 2/1988 | Khera | 365/222 |
| 4,809,233 | 2/1989 | Takemae | 365/222 |
| 4,827,453 | 5/1989 | Sawada et al. | 365/222 |
| 4,958,322 | 9/1990 | Kosugi et al. | 365/222 X |
| 5,075,886 | 12/1991 | Isobe et al. | 365/194 |
| 5,095,463 | 3/1992 | Toda et al. | 365/189.07 |
| 5,206,830 | 4/1993 | Isobe et al. | 365/222 X |
| 5,272,676 | 12/1993 | Kubono et al. | 365/222 |
| 5,301,164 | 4/1994 | Miyawaki | 365/233 |
| 5,333,128 | 7/1994 | Yoon et al. | 365/222 |

OTHER PUBLICATIONS

Hitachi Corporation, "Hitachi PSRAM Application Note", entire document (1990), Sep.

Advanced Micro Devices, "PALCE16VSH–10 EE CMOS 20-Pin High-Speed Universal Programmable Array Logic", entire document (1991), Oct.

Primary Examiner—David K. Moore
Attorney, Agent, or Firm—Gregory Garmong

[57] ABSTRACT

A controller commands the memory refreshment of a pseudo-static random access memory (PSRAM) accessible from a remote host processor. The controller includes a detector for the end of a memory access cycle by the host processor. A tapped delay line is activated by the detector at the end of the memory access cycle of the PSRAM. The tapped delay line produces a series of delay line output signals at a series of preselected times after activation. An automatic refresh of the PSRAM is initiated upon receipt of a first tapped delay line output signal. The automatic refresh is discontinued upon receipt of a second tapped delay line output signal that follows the first tapped delay line output signal by a sufficient time to permit performance of an automatic refresh. Further refresh cycles can be initiated if the host does not seek memory access, and the further refresh cycles can begin immediately or be delayed by some selected amount of time.

12 Claims, 3 Drawing Sheets

CONTROLLER FOR REFRESHING A PSRAM USING INDIVIDUAL AUTOMATIC REFRESH CYCLES

BACKGROUND OF THE INVENTION

This invention relates to random access memories, and, more particularly, to the efficient utilization of a pseudo-static random access memory that must be periodically refreshed to avoid the loss of information stored in the memory.

Computers and other devices having a memory typically utilize Random Access Memory (RAM) to achieve fast access to stored information. From the standpoint of permanency of stored information, there are three principal types of RAM. Static Random Access Memory (SRAM) retains information in memory for an indefinite period of time without refreshing (recharging) of the state of the individual memory cells. Dynamic Random Access Memory (DRAM) retains information in memory only as long as the memory cells are continually refreshed. SRAM requires relatively complex individual memory cells, which are expensive and occupy large areas on chips or cards. DRAM is less expensive and space consuming, but requires potentially complex refresh circuitry that may be expensive and may slow the access of the host processor to the memory cell. SRAM has a low current consumption because it need not be refreshed, while DRAM has a relatively high current consumption because of the need for continual refreshing.

A compromise between these characteristics is achieved in a Pseudo-Static Random Access Memory (PSRAM). The PSRAM has a simpler memory cell than the SRAM, and is therefore less-expensive and smaller than the SRAM. The PSRAM requires periodic rather than continual refreshing, as is the case for DRAM. PSRAM is provided with internal refresh circuitry, and therefore requires less complex external refresh circuitry and permits better memory access for the host processor than DRAM. PSRAM provides the cost effectiveness of DRAM with the implementation ease of SRAM. PSRAM has a current consumption intermediate that of SRAM and DRAM, and is acceptable for use in both desk top and portable devices requiring memory. PSRAM memory is available in standard memory sizes from a number of manufacturers, including, for example, Hitachi, Toshiba, Samsung, and NEC.

In the case of a typical 4 megabit PSRAM, 2048 refresh cycles must be performed every 32 milliseconds. If the refresh cycles are not completed in that period, information can be lost from memory. During the refresh cycles, each of which typically lasts at least 150 nanoseconds, the memory is not available for accessing by the host computer or other device. Various internally generated refresh modes are available in the PSRAM memory chips themselves, but these refresh modes typically do not provide optimum access performance of the system that includes the host processor and the PSRAM. Since the designers of general purpose PSRAM chips cannot know the individual applications, the internally generated refresh modes are designed to avoid memory loss, not avoid memory loss while optimizing processor/PSRAM performance.

Thus, if allowed to operate on Its own, the PSRAM may perform far too many refresh cycles with some of the refresh cycles being performed when the processor seeks access to the memory. In each case the processor eventually gains access to the memory through an interruption of the refresh cycles. However, the processor is denied access to memory when the refresh cycles are being performed, slowing down the overall performance of the system. The delays in access to memory occasioned by the need to refresh the PSRAM, though individually small, can accumulate to have a significant effect on the speed of the processor system. Excessive numbers of refresh cycles also can consume excessive power, an important consideration if the PSRAM is used in a portable, battery-powered device.

There is a need for an approach to optimizing the performance of systems that utilize a host processor and PSRAM. The approach must ensure that the PSRAM is refreshed to avoid loss of stored information, while taking into consideration the memory access requirements of the host processor. The present invention fulfills this need, and further provides related advantages.

SUMMARY OF THE INVENTION

The present invention provides a controller for PSRAM refresh. The controller is utilized in a system having a remote processor wherein timing signals are not available to the controller. Instead, the controller optimizes system performance utilizing only memory control information available on the memory bus. The controller minimizes the waiting time for the host processor to perform memory access cycles, while achieving the required refresh cycles of the PSRAM by applying required refresh cycles during the time the host is known not to access the memory and at other times as required by the PSRAM devices. The present approach is particularly useful where the PSRAM is located on a removable card that can be plugged into the unit containing the host. Only signals generally available on the host processor bus are required to accomplish PSRAM refresh control.

In accordance with the invention, a controller controls the refreshing of a pseudo-static random access memory accessible from a remote host processor. The controller comprises means for asynchronously detecting a memory enabling/disabling signal of a host processor, and means for initiating asynchronous automatic refresh of a pseudo-static random access memory upon receipt from the means for asynchronously detecting of an indication of detection of a memory enabling/disabling signal. The memory is enabling/disabling signal a change-of-state signal transmitted across the bus from the host processor to the memory, and can be detected by elements physically associated with the memory.

The memory enabling/disabling signal may be associated with the beginning or the end of a memory access cycle. When it is associated with the beginning of the memory access cycle, with some processors there may be a delay of up to several hundred nanoseconds after the transmission of the memory enabling/disabling signal and the beginning of the memory access. In such processors, an automatic refresh can be accomplished during that period, which otherwise is an idle period. (In other processors, the time between the transmission of the memory enabling/disabling signal and the start of the memory access is too short to reasonably accomplish a refresh cycle, and this aspect of the present invention would not be used.)

The memory enabling/disabling signal can also be associated with the end of a memory access cycle. In accordance with this aspect of the invention, a controller refreshes a pseudo-static random access memory (PSRAM) accessible from a remote host processor. The controller comprises means for asynchronously detecting the end of a memory access cycle by a host processor and means for generating output signals at preselected times after activation by the means for asynchronously detecting the end of a memory access cycle. The output signals include a first output signal and a second output signal a sufficient time after the first timed output signal to permit performance of an automatic refresh of the PSRAM. The controller further includes means for initiating an automatic refresh of the PSRAM upon receipt of the first timed output signal and means for discontinuing the automatic refresh of the PSRAM upon receipt of the second timed output signal.

In a preferred approach, the controller utilizes a tapped delay line to generate the output signals. In this embodiment, the controller includes means for asynchronously detecting the end of a memory access cycle by a host processor and a tapped delay line activated by the means for asynchronously detecting upon detection of the end of a memory access cycle of the PSRAM by the host processor. The tapped delay line produces a series of delay line output signals at a series of preselected times after activation. The controller further includes means for initiating an automatic refresh of the PSRAM upon receipt of a first tapped delay line output signal and means for discontinuing the automatic refresh of the PSRAM upon receipt of a second tapped delay line output signal that follows the first tapped delay line output signal by a sufficient time to permit performance of an automatic refresh. The use of a tapped delay line has the important advantage that it is not necessary to wait to begin the refresh cycle until clock pulsing can be synchronized with the refresh cycle, which may require up to a full clock cycle with each refresh cycle performed. Instead, the refresh cycle begins immediately and, in a statistical sense, can be completed most rapidly from the time that PSRAM becomes available for refresh (after completion of a memory access cycle by the host processor).

In each of these embodiments, at the end of a synchronous refresh cycle, the controller permits memory access by the host processor. If the host processor seeks access, further refresh cycles are not performed and the host is allowed access to the memory. If the host processor does not seek access during that time period, a further refresh cycle may be performed immediately after the completion of the prior refresh cycle. This strategy may, however, lead to overly many refresh cycles, which consume an unnecessarily large amount of power in PSRAM refresh. A mandatory delay between refresh cycles may therefore be implemented, even when the host processor does not demand access to the memory.

A major benefit of inserting a refresh cycle immediately after a memory access cycle begins or ends is that in nearly all systems, the host processor is known not to require memory access for some period of time immediately thereafter. If this time is the same as or greater than the time required for an automatic refresh cycle, there is no impact on the performance of the system of insertion of an automatic refresh cycle at this point. For specific processor systems, there are additional times that the host processor is known not to require memory access. These times can be determined by the memory bus control signals. In these cases, the refresh cycles may be inserted at these times instead of necessarily at the end of the memory access cycle for transparent refresh cycles.

By inserting the refresh cycles during times the host processor is known not to require access, repeated access to the memory, such as occurs during program execution, is not impacted, unlike other memory refresh strategies. This strategy provides for optimum performance during repeated memory access. In the case of infrequent access to the memory, such as using the memory for data storage, there is the same statistical chance of requesting the memory during refresh as in any other strategy. In this case, the system delays resulting from the present approach are no worse than those of any other memory refresh approach.

The present invention provides an important advance in the art of PSRAM utilization in host processor/PSRAM systems. Memory access time for the processor is optimized, consistent with the requirement for PSRAM refresh. The result is that inexpensive, small-size PSRAM may be used with improved net system performance as compared with conventional PSRAM application. Other features and advantages of the present invention will be apparent from the following more detailed description of the preferred embodiment, taken in conjunction with the accompanying drawings, which illustrate, by way of example, the principles of the invention.

DETAILED DESCRIPTION OF THE PREFERRED EMBODIMENT

Figure 1:
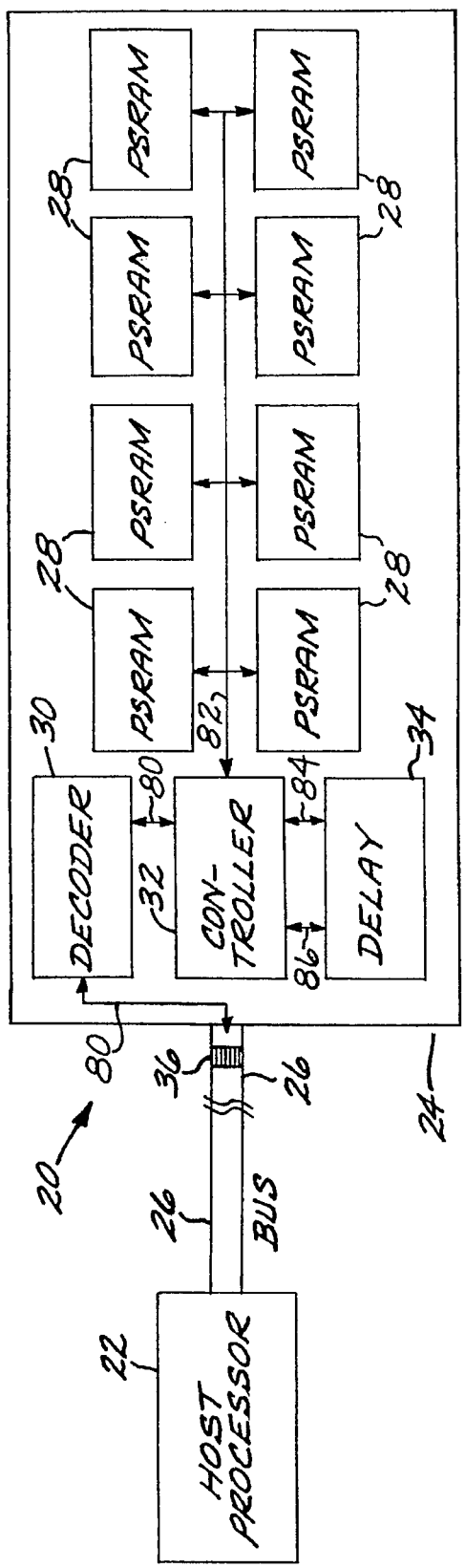
FIG. 1 is a schematic circuit diagram showing the relation of the refresh controller to the other circuit elements of a host processor/PSRAM system.

FIG. 1 shows the circuit arrangement for a preferred host-processor/PSRAM system 20 in which the controller of the invention is used. A central processing unit (CPU) 22 is connected to a memory card 24 by a bus 26. Thus, the memory card 24 has available only the signals on the bus 26, not the internal timing and state signals of the CPU 22. This is termed a "remote" or "host" processor system.

The memory card 24 has a number of PSRAM chips 28, here illustrated as eight 512K PSRAM chips 28. These chips are available commercially from a number of manufacturers, such as Hitachi, Toshiba, Samsung, and NEC. A working embodiment of the present invention has been implemented using a Model HM658512 PSRAM chip available from Hitachi. A conventional address decoder 30 permits access to the PSRAM chips 28 by the CPU 22 (via line 80). The address decoder 30 is commercially available from a number of manufacturers, and for the working embodiment a Model SN74HC139 address decoder made by Texas Instruments has been used.

A controller 32 operating according to the principles and implemented in the manner to be discussed subsequently controls the refreshing of the memory cells within the PSRAM chips 28 (via line 82). The controller 32 also controls access of the CPU 22 to the PSRAM chips 28 in conjunction with the accomplishment of the refresh cycles. The controller 32 has been implemented as a programmable array logic (PAL) device Model AMPAlCE16V8 made by Advance Micro Devices as a standard programmable component. The controller 32 utilizes a tapped delay line 34 in the manner to be discussed. The tapped delay line 34 is available as a commercial component. For the present working embodiment, a Model DS1000-200 tapped delay line made by Dallas Semiconductor was used.

In the case of the preferred design illustrated in FIG. 1, the PSRAM chips 28 must be refreshed with 2048 refresh cycles every 32 milliseconds. These particular values may vary for other designs, but may be taken as illustrative. Many strategies for refresh may be implemented. For example, the refresh cycles could be evenly distributed during the 32 millisecond period. In another approach, the refresh cycles could occur continuously, except for a period of a memory access interrupt by the CPU 22. In each case, such a strategy could lead to a reduced operating speed of the system 20 because the CPU 22 may have to consistently wait for overly long periods to gain memory access.

Figure 2:
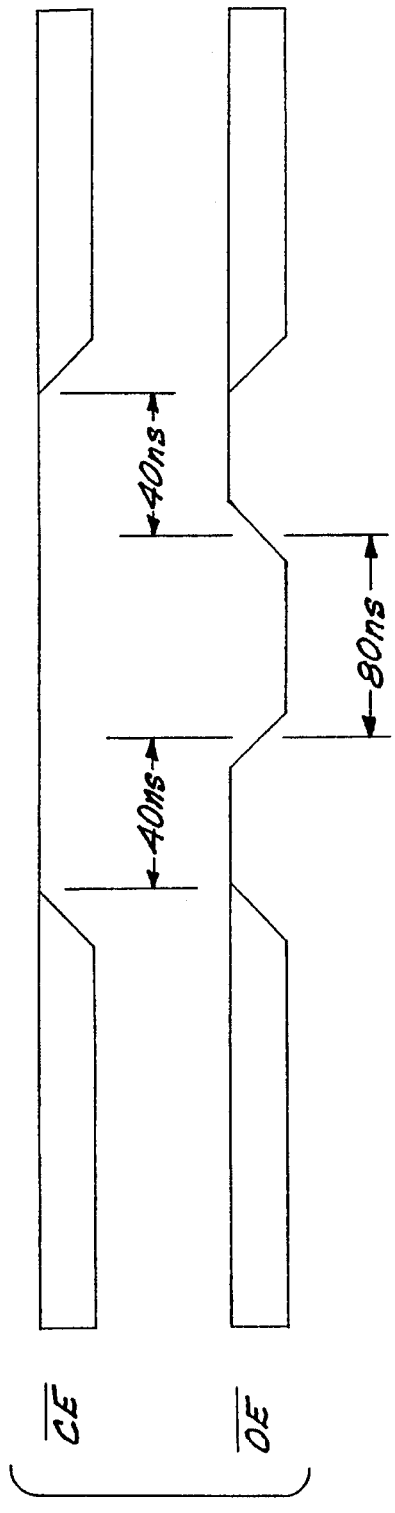
FIG. 2 is a timing diagram for a refresh cycle at the end of a memory access cycle.

In the present approach, individual optimized refresh cycles are performed. A single optimized refresh cycle for the 512K×8 PSRAM memory of FIG. 1 is illustrated in FIG. 2. Each refresh cycle 160 nanoseconds. The refresh cycle begins when both the chip enable (CE) signal and the output enable (OE) states become inactive, indicating that the CPU 22 is not seeking to access the memory 28. After 40 nanoseconds, OE goes active, the refresh cycle is completed in another 80 nanoseconds, and both CE and OE must go inactive for an additional 40 nanoseconds to allow the device to recover from refresh. The memory 28 is unavailable to the CPU 22 during this 160 nanosecond period.

The chip enable CE signal is a memory enabling/disabling signal. It is active when the host CPU 22 seeks access to the memory, and inactive when the host CPU 22 does not seek access to the memory. The transitions between inactive and active, and between active and inactive, are associated with the start and end of a memory access cycle, respectively.

Figure 3:
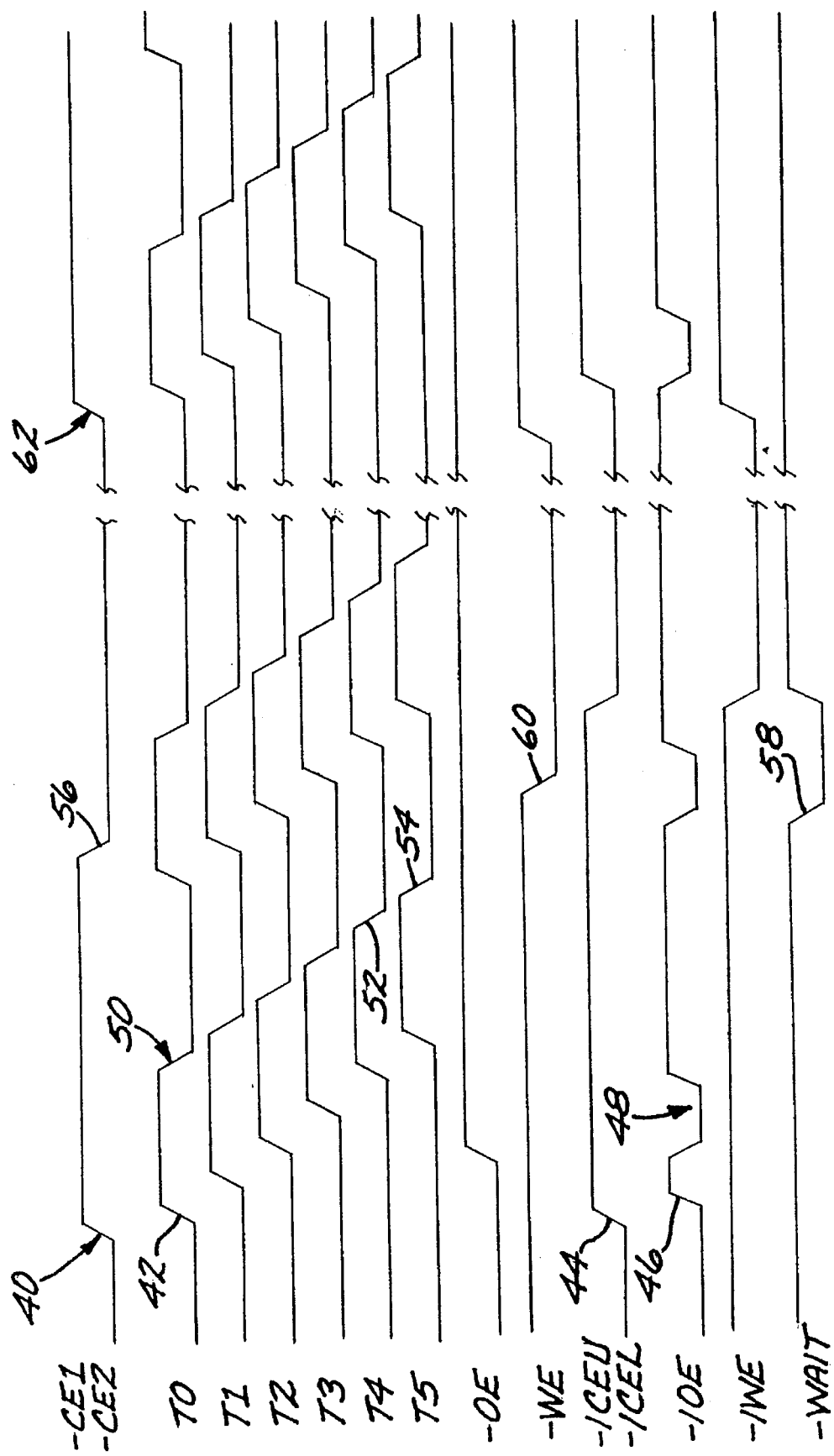
FIG. 3 is a timing diagram for the PSRAM controller of the invention.

The timing to achieve this refresh cycle at the end of a period of memory access by the host is illustrated in FIG. 3. In this timing diagram, the card enable (CE1 and CE2), the output enable (OE), and the write enable (WE) signals are all generated by the host CPU 22 to request read and write cycles of the memory system (via line 80). These signals are available on the bus 26, and are the only signals that the controller 32 receives from the CPU 22. Specifically, the controller 32 does not receive synchronous (clock) timing signals or other processor state information from the CPU 22 that could otherwise be used as an aid in controlling the refresh cycle.

The internal chip enables (ICEU and ICEL), the internal output enable (IOE), and the internal write enable (IWE) signals are all generated by the controller 32 for memory control (via line 82). (ICEU is the chip enable for the upper 8 bits of the 16-bit word, and ICEL is the chip enable for the lower 8 bits of the 16-bit word.) The primary timing control signal T0 is generated by the controller S2 and sent to the tapped delay line 34 (via line 84). Responsive to this signal T0, the delay line 34 generates a series of five delay line output signals T1, T2, T3, T4, and T5, at 40, 80, 120, 160, and 200 nanoseconds, respectively, after receipt of signal T0 by the delay line 34 (via line 86). It will be appreciated that not all of these signals T1–T5 are required by the controller 32 to perform its functions, and that a tapped delay line of another configuration could be used. The present choice of a preferred delay line was made to be consistent with the basic timing requirements of the refresh cycle of FIG. 2 and also to be commercially available at reasonable cost.

It should be noted that other timing devices could be used to provide timed output signals. For example, the memory card 24 could be provided with an onboard general purpose clock instead of the delay line 34. The use of a clock is not preferred, however, because it would be necessary to synchronize the phase relationship of the clock with the CPU 22 and wait until the clock is in the proper state before commencing the refresh cycle. In the preferred approach, the timing is generated asynchronously, and it is therefore possible to begin the refresh cycle of the PSRAM immediately after a memory access cycle has been completed.

Referring again to FIG. 3, the CPU 22 indicates the end of a memory access cycle by sending CE1 and CE2 inactive, numeral 40. The leading edge of the state transition is detected, sending T0 high, numeral 42, ICEU and ICEL high, numeral 44, and IOE high, numeral 45, to begin a refresh cycle. While T0 is high, a refresh cycle is underway, and the CPU 22 is denied access to the memory 28. Again, it is noted that the refresh cycle begins immediately after completion of the memory access cycle, due to the use of the delay line. There is no need to wait up to one clock cycle, as would be the case if a general purpose clock were used to generate timed output signals.

The T0 rising edge produced by the controller 32 is introduced into the delay line 34, which produces delay line output signals at T1 (40 nanoseconds after T0), T2 (80 nanoseconds), T3 (120 nanoseconds), T4 (160 nanoseconds), and T5 (200 nanoseconds ). When T1 is high and T3 is low, numeral 48, IOE goes active to perform an automatic refresh cycle, which is an internal function of the PSRAM chip 28. When T4 goes high, T0 goes low, indicating the end of the refresh cycle, numeral 50.

The CPU 22 is permitted to request access to the memory 28 when T4 is high. If the card enables CE1 and CE2 have not gone low to indicate a requested access by the CPU 22 before T4 goes low, numeral 52, another refresh cycle is initiated when T5 goes low, numeral 54. Thus, in this case T5 becomes a refresh initiation signal for a further automatic refresh cycle, following immediately after the preceding automatic refresh cycle. The succession of automatic refresh cycles continues according to this strategy until the CPU 22 has requested access while T4 is high. The maximum time that the CPU 22 must wait for access to memory is therefore 160 nanoseconds, like other refresh schemes, but for consecutive memory access cycles the overhead is nearly zero nanoseconds.

If, on the other hand, CE1 and CE2 go low while T1 is high (a refresh cycle is occurring), indicating a request for access by the CPU 22 to the memory 28, WAIT goes active, numeral 58, and stays active until the refresh cycle then being executed has been completed. After that particular refresh cycle has been completed, the CPU 22 is allowed access to the memory 28. If either the WE or OE signals goes active during a refresh cycle, they are not permitted to go to the memory chips 28 via either IEW or IOE until after the refresh cycle then being performed has ended, numeral 58. After any memory access cycle by the CPU 22 has ended and the card enables CE1 and CE2 go high, another refresh cycle may commence according to the steps discussed earlier.

These procedural steps have been implemented in a PAL controller structure according to the following industry standard PALASM Boolean logic equations:

$$T0 = ((ACREQN * /T1 * /T3 * /T5)$$
$$+ (/ACREQN * CE1N * CE2N))$$
$$* ((T0 * T4) + /T0)$$
$$+ /((T0 * T4) + /T0)$$

MINIMIZE_OFF $$ACREQU = (CE1N*CE2N*T4) + \\ (CE1N*CE2N*ACREQN) + \\ (/T4*ACREQN)$$

MINIMIZE_ON
   ICELN=T0+(ACREQN)+CE1N
   ICEUN=T0+(ACREQN)+CE2N
   IOEN=(T0*T3)+(/T1*T0)+(/T0*OEN)
   /WAIT=(ACREEQN+T0)*(/CE1N+/CE2N)
   IWEN=T0+WEN where + is "or", * is "and", and / is "invert".

This preferred timing diagram was designed for a desk top computer where the principal concern is performance and access, not power consumption. Under this strategy, many more refreshes of the PSRAM 28 may be performed than is required to prevent loss of information. As a result, more power may be consumed in performing refresh cycles than is absolutely required.

To reduce the number of refresh cycles, a mandatory delay between refresh cycles may be introduced. Thus, for example, it may be determined that the refresh cycles can be spaced apart by at least 8 milliseconds, even if the CPU 22 is not demanding access to the memory 28. A preferred approach is to use the delay generator of FIG. 4 (again avoiding the need for an onboard clock).

Figure 4:
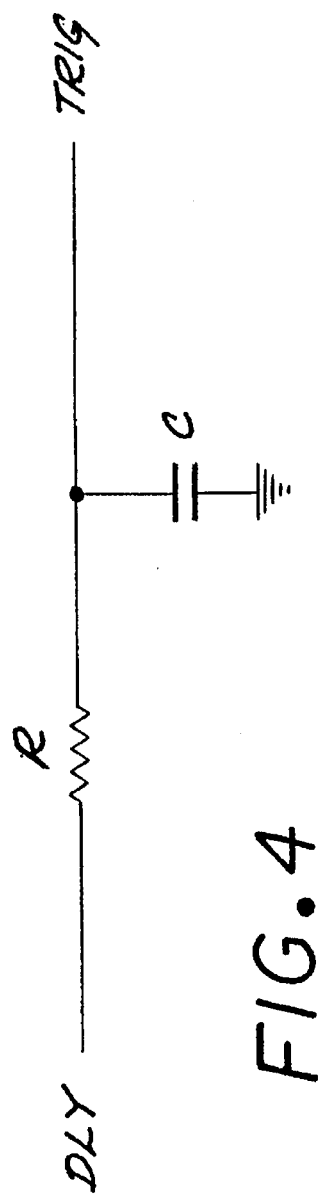
FIG. 4 is a schematic circuit diagram for a further delay line signal.

In the circuit of FIG. 4 as used with the timing process of FIG. 3, when T0 is high, TRIG and DLY are both outputs and are driving low. When T0 goes low, TRIG becomes an input. For timing, DLY goes from 0 to 1, and when TRIG crosses the input threshold, the timer has timed out. The delay for this circuit is roughly ½ RC, so the delay time can be adjusted as necessary. DLY is asserted after T5 goes low, and after TRIG goes high, a dummy refresh cycle is performed to synchronize the card enables to T4 falling, as in the previously described approach. After that dummy refresh cycle is performed, a new refresh cycle begins.

The self refresh mode available in commercial PSRAM chips can also be utilized wherever possible, depending upon the access demands of the host CPU 22. That is, the controller 32 is of most value when refresh is required interspersed with significant memory access requirements of the host processor. Where, for example, the CPU is inactive and waiting for instructions, conventional self refresh mode may be employed. Timing and access requirements are not a concern in this mode. After a period of self refreshment operation using the timer previously described, the card can be placed into an extended self refresh mode. After the CPU again demands access, requiring the system to "wake up", WAIT is asserted for a sufficient period, typically 600 nanoseconds, to permit the PSRAM chip 28 to recover from self refresh mode. The fast refresh mode of FIG. 3 would be required for the next several milliseconds to ensure no loss of information in memory. Thereafter the card 24 returns to the slowed refresh mode using the timer of FIG. 4 and then, if further access by the CPU is not demanded, back to the internal self refreshment mode.

Figure 5:
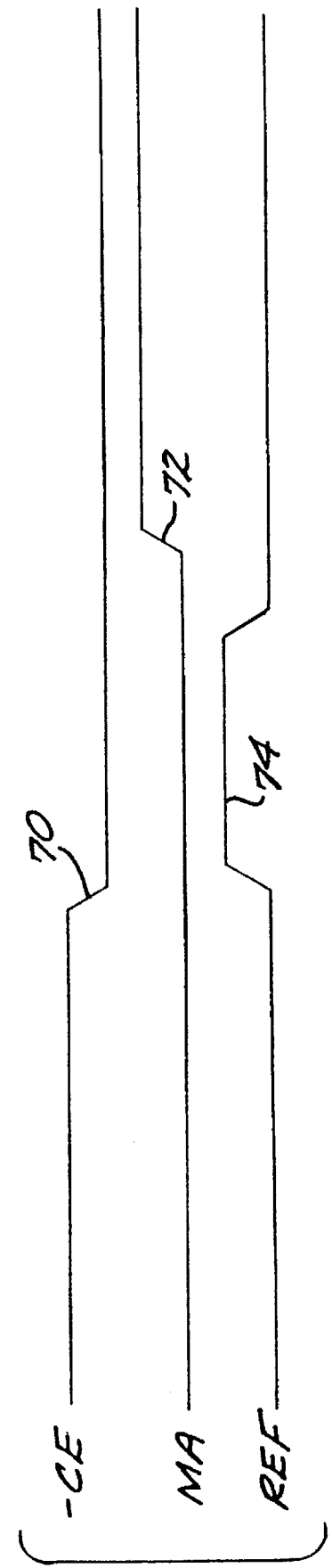
FIG. 5 is a timing diagram for a refresh cycle at the beginning of a memory access cycle.

The present approach can also be applied to the insertion of a refresh cycle at the beginning of a memory access cycle. Referring to FIG. 5, a memory access cycle begins with the chip enable CE signal becoming active, numeral 70. In some, but not all host processor systems, there follows a period of 100–200 nanoseconds or more before memory access MA actually begins, numeral 72. In that period, a PSRAM automatic refresh cycle REF, numeral 74, may be inserted. The details of the automatic refresh cycle are as discussed in relation to FIG. 2. Typically, there will not be sufficient time for further refresh cycles between CE going active and the beginning of memory access, but multiple refresh cycles could be used if appropriate.

The present invention therefore provides a highly versatile controller for optimizing the operation and access of the CPU to the information stored in PSRAM, while ensuring refreshment of the PSRAM and minimizing power consumption if necessary. The invention has been implemented in the fully hardware configuration depicted herein through the use of the described logic, and has been found fully operable. In this approach, the controller 32, the PSRAM 28, the decoder 30, and the tapped delay line 34 are all mounted on the card 24 that can be plugged into a processor system. A connector 36 is placed between the card 24 and the bus 26/CPU 22. The card is simply plugged into the system to provide additional PSRAM with the automatic refreshing features discussed herein.

Although a particular embodiment of the invention has been described in detail for purposes of illustration, various modifications may be made without departing from the spirit and scope of the invention. Accordingly, the invention is not to be limited except as by the appended claims.

What is claimed is:

1. Apparatus for refreshing a pseudo-static random access memory accessible from a remote host processor, the apparatus comprising:

means for asynchronously detecting an end of a memory access cycle by the host processor;

a tapped delay line activated by the means for asynchronously detecting upon detection of the end of a memory access cycle of the pseudo-static random access memory by the host processor, the tapped delay line producing a series of delay line output signals at a series of preselected times after activation;

means for initiating an automatic refresh of the pseudo-static random access memory upon receipt of a first tapped delay line output signal; and means for discontinuing the automatic refresh of the pseudo-static random access memory upon receipt of a second tapped delay line output signal that follows the first tapped delay line output signal by a sufficient time to permit performance of an automatic refresh.

2. The apparatus of claim 1, further including means for determining whether the host processor seeks to initiate a memory access cycle of the pseudo-static random access memory;

means for initiating a further automatic refresh of the pseudo-static random access memory upon receipt of a further refresh initiation signal, if the means for determining indicates that the host processor does not seek to initiate a memory access cycle of the pseudo-static random access memory.

3. The apparatus of claim 2, wherein the further refresh initiation signal is the second tapped delay line output signal.

4. The apparatus of claim 2, further including means for generating a further delay line output signal at a preselected time after the receipt of the second delay line output signal, and wherein the further refresh initiation signal is the further delay line output signal.

5. The apparatus of claim 1, wherein the means for asynchronously detecting, the tapped delay line, and the pseudo-static random access memory are all located on a single card connectable to a bus of the host processor.

6. Apparatus for refreshing a pseudo-static random access memory accessible from a remote host processor, the apparatus comprising:

means for asynchronously detecting the end of a memory access cycle by the host processor;

means for generating output signals at preselected times after activation by the means for asynchronously detecting the end of a memory access cycle, the output signals including a first output signal and a second output signal a sufficient time after the first timed output signal to permit performance of an automatic refresh of the pseudo static random access memory;

means for initiating an automatic refresh of the pseudo-static random access memory upon receipt of the first timed output signal; and means for discontinuing the automatic refresh of the pseudo-static random access memory upon receipt of the second timed output signal.

7. The apparatus of claim 6, wherein the means for generating output signals is a clock.

8. The apparatus of claim 6, wherein the means for generating output signals is a delay line.

9. The apparatus of claim 6, further including means for determining whether the host processor seeks to initiate a memory access cycle of the pseudo-static random access memory;

means for initiating a further automatic refresh of the pseudo-static random access memory upon receipt of a further refresh initiation signal, if the means for determining indicates that the host processor does not seek to initiate a memory access cycle of the pseudo-static random access memory.

10. The apparatus of claim 9, wherein the further refresh initiation signal is the second timed output signal.

11. The apparatus of claim 9, further including means for generating a further timed output signal at a preselected time after the receipt of the second timed output signal, and wherein the further refresh initiation signal is the further delay line output signal.

12. The apparatus of claim 6, wherein the means for asynchronously detecting, the means for generating output signals, and the pseudo-static random access memory are all located on a single card connectable to a bus of the host processor.

* * * * *